(12) United States Patent
Xin

(10) Patent No.: US 7,464,310 B2
(45) Date of Patent: Dec. 9, 2008

(54) PROGRAMMABLE STATE MACHINE OF AN INTEGRATED CIRCUIT

(75) Inventor: Weizhuang (Wayne) Xin, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 1016 days.

(21) Appl. No.: 10/260,361

(22) Filed: Sep. 30, 2002

(65) Prior Publication Data

US 2004/0064770 A1 Apr. 1, 2004

(51) Int. Cl.
*G01R 31/317* (2006.01)
*G01R 31/40* (2006.01)

(52) U.S. Cl. .................... 714/726; 714/724

(58) Field of Classification Search ............ 714/726, 714/724, 718, 699, 100, 25, 30, 32, 37, 40, 714/48, 725, 734; 710/71; 327/202
See application file for complete search history.

(56) References Cited

U.S. PATENT DOCUMENTS

| | | | | |
|---|---|---|---|---|
| 4,099,668 A | * | 7/1978 | Feilchenfeld et al. | 714/724 |
| 4,387,424 A | * | 6/1983 | Frediani et al. | 709/225 |
| 5,281,864 A | * | 1/1994 | Hahn et al. | 327/202 |
| 5,511,173 A | * | 4/1996 | Yamaura et al. | 712/248 |
| 6,128,681 A | * | 10/2000 | Shephard | 710/71 |
| 6,130,674 A | * | 10/2000 | Vaswani et al. | 345/586 |
| 6,349,397 B1 | * | 2/2002 | Koga et al. | 714/727 |
| 6,349,405 B1 | * | 2/2002 | Welfeld | 717/170 |
| 6,687,861 B1 | * | 2/2004 | Jordan et al. | 714/718 |
| 6,748,564 B1 | * | 6/2004 | Cullen et al. | 714/729 |
| 6,760,866 B2 | * | 7/2004 | Swoboda et al. | 714/34 |
| 6,834,361 B2 | * | 12/2004 | Abbott | 714/42 |
| 6,910,119 B1 | * | 6/2005 | Douglas | 712/216 |
| 2001/0047498 A1 | * | 11/2001 | Whetsel | 714/726 |
| 2003/0172333 A1 | * | 9/2003 | Wehage | 714/726 |

OTHER PUBLICATIONS

Himanshu Bhatnagar, Kluwer Academic Publishers, "Advanced ASIC Chip Synthesis" Second Edition, Copyright 2002.

* cited by examiner

*Primary Examiner*—Cynthia Britt
*Assistant Examiner*—Dipakkumar Gandhi
(74) *Attorney, Agent, or Firm*—Garlick Harrison & Markison; Timothy W. Markison

(57) ABSTRACT

A programmable state machine of an application specific integrated circuit (ASIC) is programmed by enabling the scan mode of the integrated circuit. The process of programming the state machine continues by loading, through at least one scan chain to which the state machine is coupled, at least one timing sequence instruction into scan capable registers of the state machine. Once the at least one timing sequence instruction has been loaded into the scan capable registers, the scan mode is disabled and normal mode of the integrated circuit is resumed.

30 Claims, 7 Drawing Sheets

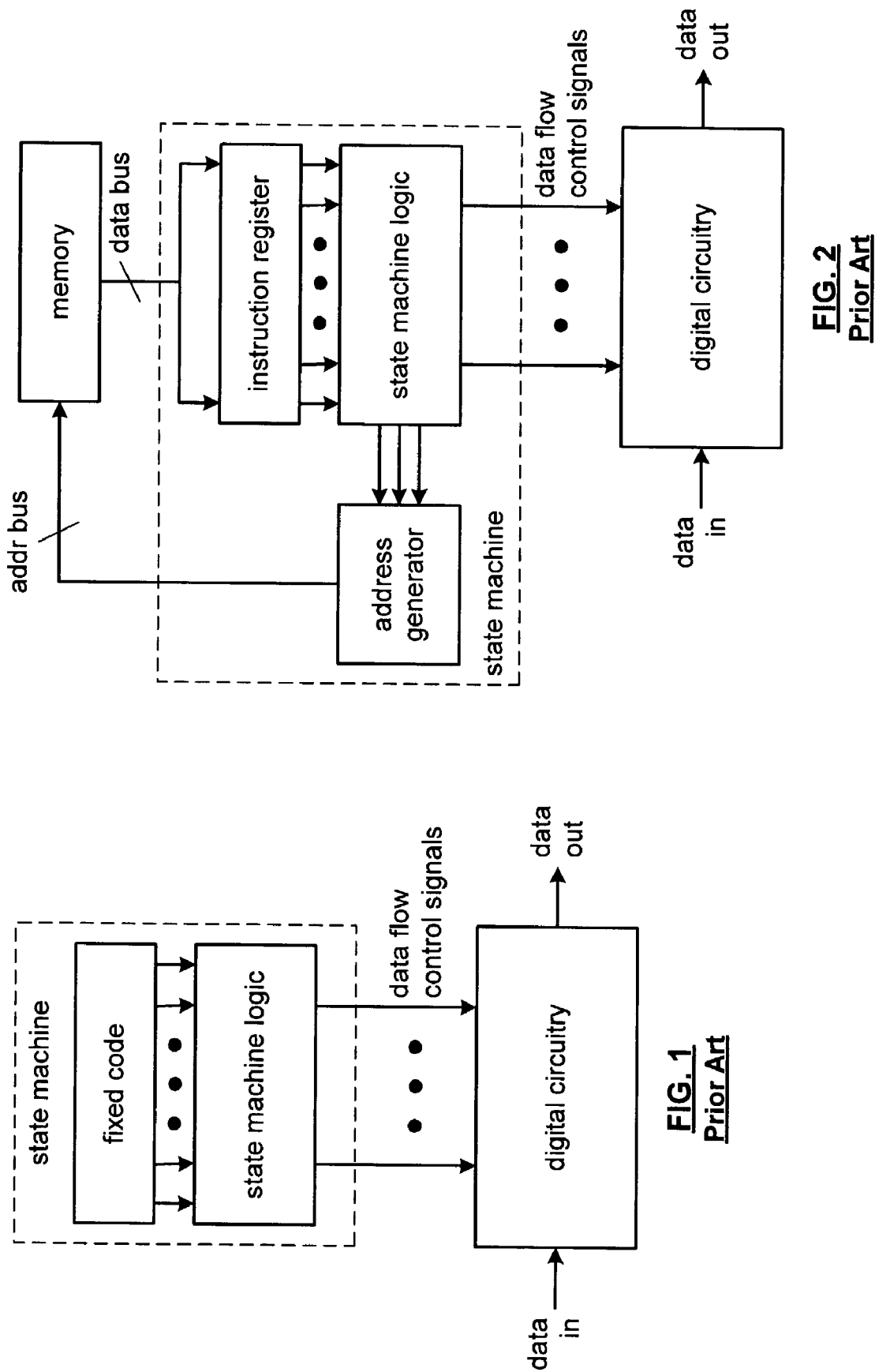

scan-enabled flip-flp
Prior Art programmable ASIC 10

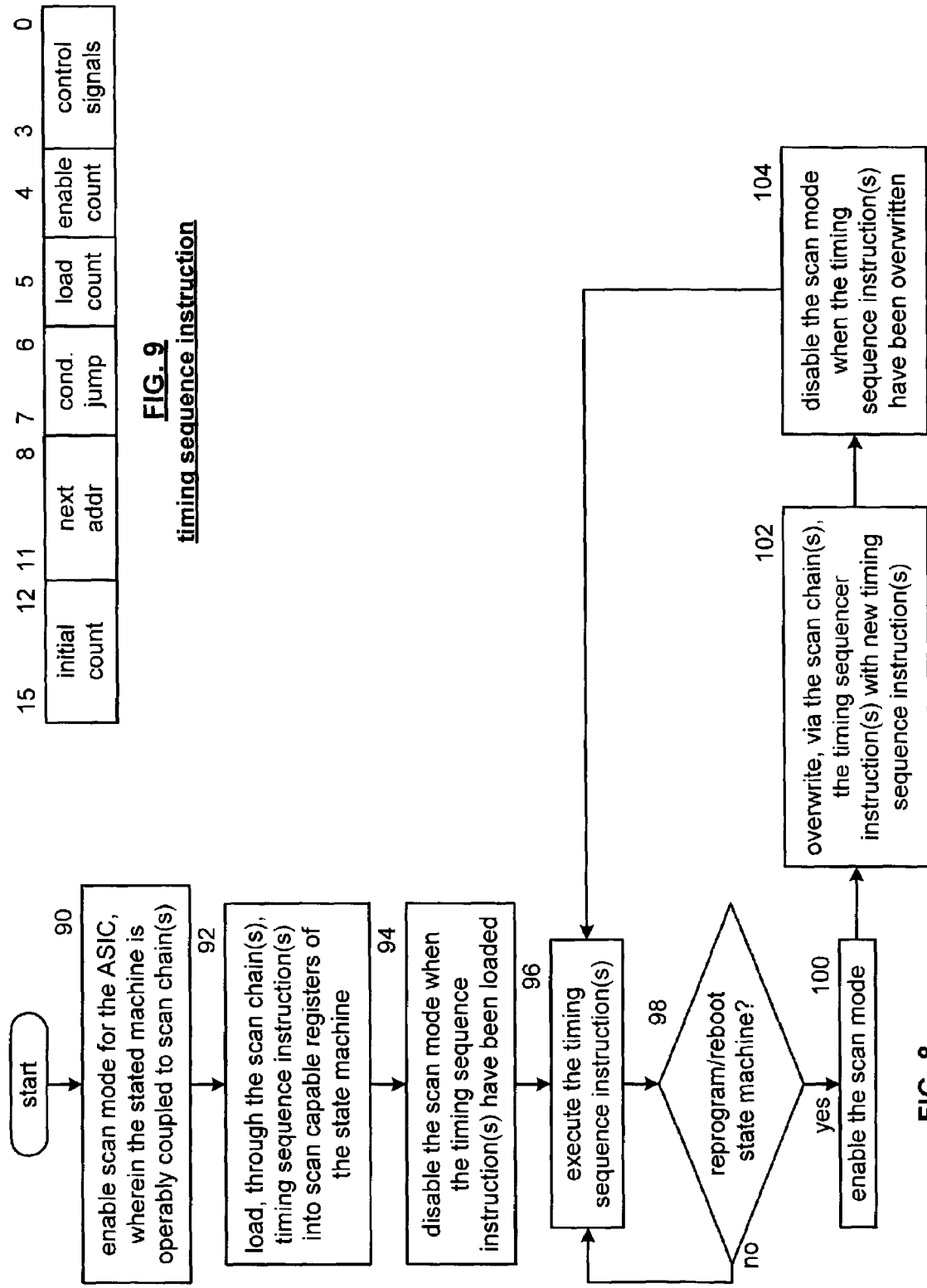

PROGRAMMABLE STATE MACHINE OF AN INTEGRATED CIRCUIT

BACKGROUND OF THE INVENTION

1. Technical Field of the Invention

This invention relates generally to integrated circuits and more particularly to a programmable application specific integrated circuit.

2. Description of Related Art

As is known, integrated circuits are used in a wide variety of electronic devices, such as computers, telecommunication equipment (servers, switches, private branch exchanges, routers, bridges, et cetera), cellular telephones, land lined telephones, home entertainment equipment, et cetera. Such integrated circuits can contain millions of transistors to perform a variety of fixed or programmable functions. The functions may be proprietary and/or in accordance with one or more standards. Typically, the more programmability an integrated circuit provides, the more gates (i.e., transistors) it requires to implement. Not surprisingly, the cost of design and manufacture of integrated circuits increase as the number of gates increase. Also, the yield (i.e., the number of usable integrated circuits per total number of integrated circuits fabricated on a wafer) decreases as the size of the integrated circuit die increases, which is dependent on the particular integrated circuit fabrication process used.

As such, integrated circuit designers and system designers (i.e., engineers who design electronic equipment that includes integrated circuits) are faced with design trade-off decisions. Those being, design and/or use applications specific integrated circuits (ASIC), which are smaller and thus less expensive but are not programmable, or used programmable integrated circuits such as field programmable gate arrays, microprocessors, microcontrollers, which provide programmable functions, but at an increased cost and size. Alternatively, the designers may use a combination of ASICs with programmable integrated circuits.

For many standard based user devices (e.g., cellular telephones, wireless local area network modems, computers, et cetera), ASICs are the preferred integrated circuit because of cost, operating speed, and ease of use. Such ASICs may contain analog circuitry, digital circuitry and/or memory to perform the prescribed function or functions of the particular standard. Typically, the digital circuits include digital logic blocks to perform specific logic functions and data flow control state machines that control the flow of data through the digital logic blocks.

FIG. 1 is a schematic block diagram of digital circuits of an application specific integrated circuit (ASIC). As shown, the digital circuitry receives digital input data and produces digital output data therefrom in accordance with a particular logic function of the digital circuitry. In addition, the flow of data through the digital circuitry is controlled based on data flow control signals produced by the state machine. The state machine includes state machine logic that generates the data flow control signals based on fixed codes. For example, the fixed codes may indicate the number of clock cycles for the data to be processed by a particular section of the digital circuitry, branches within the digital circuitry based on conditions, et cetera.

Typically, an integrated circuit (IC) designer may utilize an integrated circuit design tool such as Verilog or VHDL (hardware description language) to fabricate the state machine and corresponding digital circuitry. Utilizing one of these IC design tools, the state machine is typically generated utilizing case statements to produce the corresponding data flow control signals. Alternatively, the IC designer may fabricate the state machine as a timing sequencer that utilizes micro-code instructions to produce the data flow control signals.

While the digital circuitry and state machine of FIG. 1 provide a specific desired function or functions, it is not programmable. As such, if an error was made in the generation of the fixed code, the specification changes, and/or other errors exist in the design of the digital circuitry and/or state machine, the ASIC needs to be at least partially re-designed to overcome the error and/or specification change. Accordingly, a new mask set, or portion thereof, must be fabricated and a new version of the ASIC manufactured before testing can resume. As is known, the generation of a new mask set and subsequent fabrication of a revised ASIC takes many weeks to obtain silicon for testing, which substantially extends the development cycle of the ASIC.

FIG. 2 is a schematic block diagram of an alternate state machine coupled to digital circuitry. The state machine generates the data flow control signals, which control the flow of data through the digital circuitry. In this embodiment, however, the state machine includes an instruction register, state machine logic, an address generator, which addresses memory, which may be on-chip and/or off-chip. The memory stores the corresponding instructions for the state machine logic. While this implementation allows for re-programmability of the state machine, the ASIC must include an address bus, which may be 16 bits, 32 bits or 64 bits, depending on the size of the memory, and a data bus, which may be 16 bits, 32 bits or 64 bits depending on the size of the memory, and a fully functional address generator. As such, in comparison with the state machine of FIG. 1, the state machine of FIG. 2 requires a significant amount of extra gates to implement. Also, the state machine of FIG. 2 is significantly larger in die area than the state machine of FIG. 1.

In addition to the above, an ASIC may have many state machines (e.g., ten or more), and each of these state machines may only have a small number of states (e.g., ten states or less), where each state corresponds to a timing sequencer micro-code instruction. Typically, an ASIC includes many small memory blocks (e.g., random access memory) to store the micro-instructions of each of the numerous state machines. In current IC manufacturing processes (e.g., CMOS), the memory block memory blocks must be of a minimum size, which for RAM is approximately 128 words. As such, the memory blocks are significantly greater than the 10 micro-code instructions per state machine need, which is not economical. Further, many small memory blocks may cause problem in layout of integrated circuit that mixes standard library cells with custom cells.

While ASICs and other types of integrated circuits provide a great deal of functionality in a very small package, testing the millions of transistors in the integrated circuits is an ever-increasing challenge. Currently, many ASICs include test circuitry such as scan insertion, memory built-in self test (BIST) insertion, logic BIST insertion and/or boundary scan insertion. In general, boundary scan insertion tests for connections between the ASIC and the printed circuit board on which it is mounted. The memory BIST includes a logic controller that utilizes various algorithms to generate input patterns to exercise the memory of the ASIC. The logic BIST is similar to the memory BIST, but it exercises the logic of the ASIC via one or more scan chains (scan chains will be described subsequently with reference to FIG. 4) as opposed to memory.

Scan insertion involves replacing the flip-flops of the digital logic circuits of the ASIC with scan enabled flip-flops for the sole purpose of testing. FIG. 3 illustrates a schematic block diagram of a scan enabled flip-flop. As shown, the scan enabled flip-flop includes a multiplexor and a flip-flop. During scan mode, the multiplexor is enabled to pass the scan input data (SD) to the flip-flop. In addition, the clocking of the flip-flop may be controlled via the memory BIST or logic BIST. Once testing is over, the scan enable signal (SE) to the multiplexor is set in normal mode such that normal data (D) is provided to the flip-flop via the multiplexor.

FIG. 4 is a schematic block diagram of a portion of an ASIC that includes a plurality of scan enabled flip-flops coupled together via a scan chain and digital logic. The digital logic may be the state machine logic of FIG. 1 or 2 and/or the digital circuitry of FIGS. 1 and 2. As shown, the plurality of scan enabled flip-flops are coupled in a serial fashion to produce the scan chain, which is illustrated via the bold lines. Accordingly, a first scan enabled flip-flop of the scan chain receives scanned input data (SD in). The remainder of the flip-flops in the scan chain receive their scanned input (SD) from the output of the preceding flip-flop. Accordingly, during scan mode, the test circuitry may insert a series of patterns via the scan chain to test a majority of the ASIC.

While there is a variety of design choices for IC designers and systems designers, a need still exists for a programmable application specific integrated circuit (ASIC) design that does not substantially increase gate count with respect to fixed logic ASICs, but provides a great deal of programmability, thus avoiding the need to generate new mask sets when errors are discovered in the design and/or the specifications change during the development phase.

BRIEF SUMMARY OF THE INVENTION

The programmable state machine of an application specific integrated circuit (ASIC) of the present invention substantially meets these needs and others. In one embodiment, a state machine may be programmed by enabling the scan mode of the integrated circuit. The process of programming the state machine continues by loading, through at least one scan chain to which the state machine is coupled, at least one timing sequence instruction into scan capable registers of the state machine. Once the at least one timing sequence instruction has been loaded into the scan capable registers, the scan mode is disabled and normal mode of the integrated circuit is resumed. As such, by utilizing the scan chain, and designing the state machine to utilize timing sequence instructions, the state machine may be re-programmed when errors are found and/or when specification changes occur.

An embodiment of a programmable state machine includes a processing module and memory. The memory stores operational instructions that cause the processing module to enable scan mode for the integrated circuit. While in scan mode, the operational instructions cause the processing module to load, through at least one scan chain to which the state machine is coupled, at least one timing sequence instruction into scan capable registers of the state machine. Once the at least one timing sequence instruction is loaded, the operational instructions cause the processing module to disable the scan mode and return to normal operating mode for the integrated circuit.

Another embodiment of a programmable state machine of an integrated circuit includes at least one instruction register and state machine logic circuitry. The at least one instruction register includes a plurality of scan enabled flip-flops operably coupled via at least one scan chain to store at least one timing sequence instruction. When the integrated circuit is in scan mode, the at least one timing sequence instruction is written into the plurality of scan enabled flip-flops. During normal mode, the state machine logic circuitry processes the at least one timing sequence instruction to produce at least one control signal that controls the data flow of digital circuitry.

An embodiment of a programmable application specific integrated circuit (ASIC) includes a plurality of data flow control state machines, a plurality of digital circuit modules, and a control module, which may be part of JTAG (Joint Test Action Group) controller and include an instruction for initialization of state machines. Each of the data flow control state machines generates at least one control signal that controls the data flow of at least one of the digital circuit modules. In addition, each of the data flow control state machines includes at least one instruction register and state machine logic circuitry. The at least one instruction register includes a plurality of scan enabled flip-flops that store at least one timing sequence instruction, which may be programmed during scan mode of the ASIC. The state machine logic circuitry processes, during normal mode of the ASIC, the at least one timing sequence instruction to produce the at least one control signal. The control module is operably coupled to establish the scan mode, the normal mode and programming of the state machine based on a mode select input.

BRIEF DESCRIPTION OF THE SEVERAL VIEWS OF THE DRAWINGS

FIG. 1 is a prior art schematic block diagram of a portion of an application specific integrated circuit;

FIG. 2 is a prior art schematic block diagram of an alternate portion of an application specific integrated circuit;

FIG. 8 is a logic diagram of a method for programming a state machine in accordance with the present invention;

FIG. 9 is a diagram of an example of a timing sequence instruction in accordance with the present invention.

DETAILED DESCRIPTION OF THE INVENTION

Figures 3, 4:
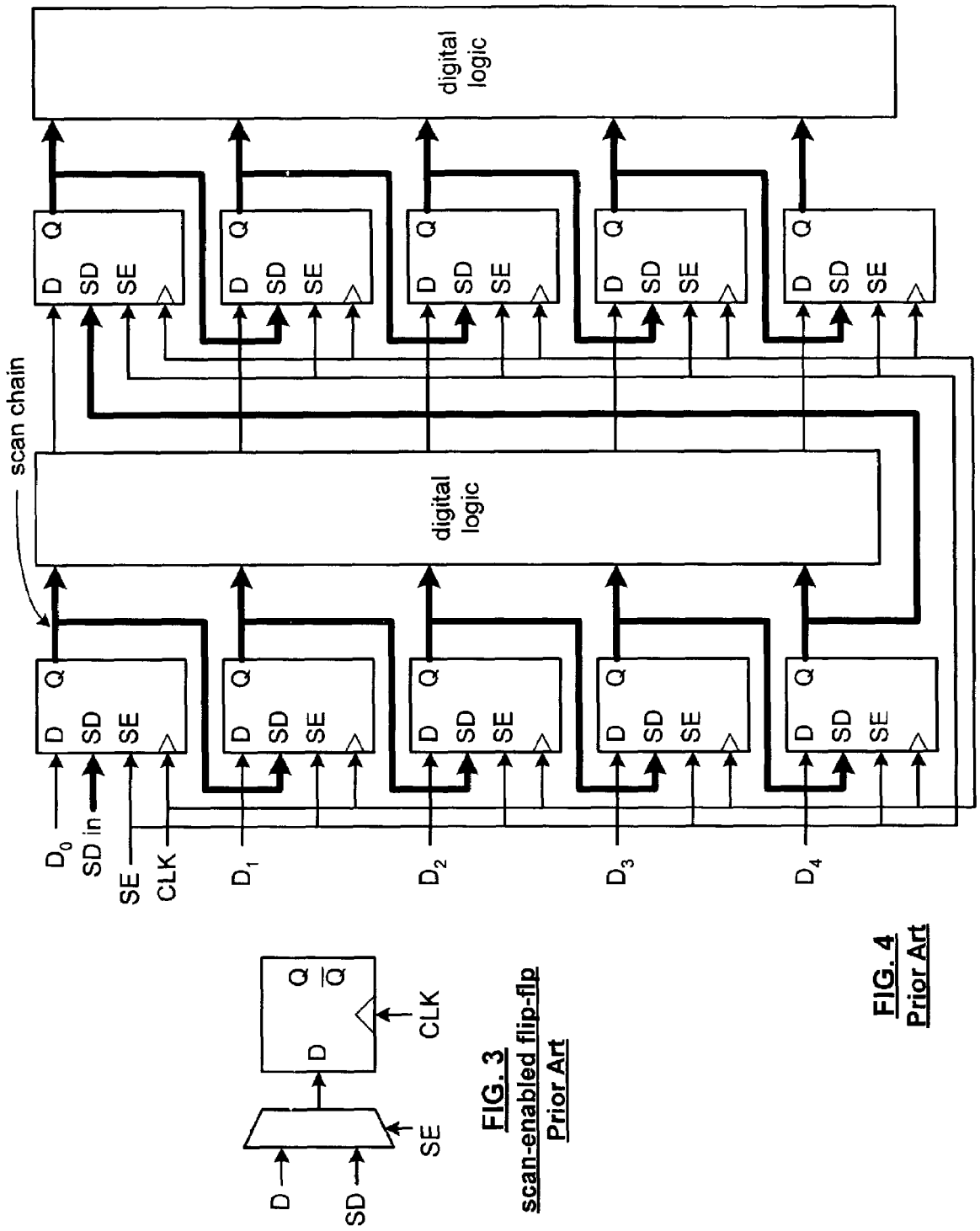
FIG. 3 is a prior art schematic block diagram of a scan enabled flip-flop.
FIG. 4 is a prior art schematic block diagram of a portion of an integrated circuit that includes a scan chain.
Figure 5:
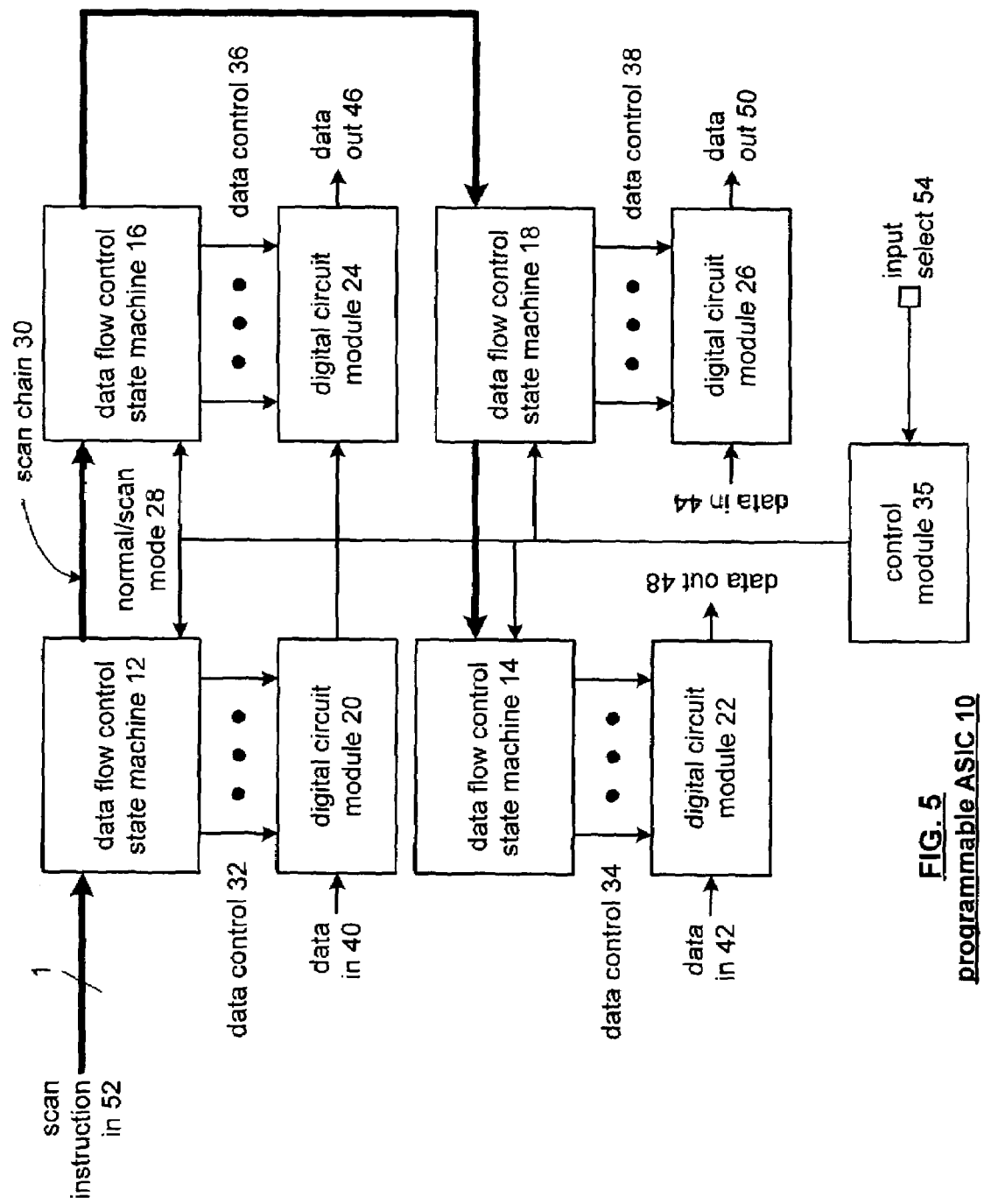
FIG. 5 is a schematic block diagram of a programmable ASIC (application specific integrated circuit) in accordance with the present invention.

FIG. 5 is a schematic block diagram of a programmable application specific integrated circuit (ASIC) 10. The programmable ASIC 10 includes a plurality of data flow control state machines 12-18, a plurality of digital circuit modules 20-26, a control module 35, and a scan chain 30. As shown, the scan chain 30 is a serial bit line that couples the data flow control state machines 12-18 together. The digital circuit modules 20-26 process digital input data in accordance with a logic function or functions implemented therein to produce corresponding digital output data based on data control signals 32-38, which are produced by the state machines 12-18. In particular, digital circuit module 20 processes digital input data 40 and produces a digital output based on the data flow control signals 32. The output of digital circuit module 20 may be provided to the exterior of the ASIC 10 or to another digital circuit module. In this example, the output of digital circuit module 20 is provided to digital circuit module 24.

Digital circuit module 24 processes the digital data received from digital circuit module 20 and produces digital data output 46 based on the data control signals 36. Digital circuit module 22 processes digital input data 42 and produces digital output data 48 based on data control signals 34. The digital circuit module 26 processes digital input data 44 and produces digital output data 50 based on data flow control signals 38. The digital circuit modules 20-26 may be of any digital logic design to perform one or more digital logic functions, which may be proprietary functions or functions in accordance with one or more standards. Accordingly, the digital circuit modules may include digital logic gates (e.g., AND gates, OR gates, NOR gates, NAND gates, et cetera), digital operands (e.g., multipliers, adders, dividers, et cetera), delay modules, digital filters (e.g., finite impulse response filters, infinite impulse response filters), memory, et cetera.

The control module 35, which may be part of JTAG controller and include at least one instruction for programming at least one state machine, includes a processing module and memory to coordinate the programming and reprogramming of at least one state machine of the ASIC 10. The processing module may be a single processing device or a plurality of processing devices. Such a processing device may be a microprocessor, micro-controller, digital signal processor, micro-computer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, and/or any device that stores digital information. Note that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory stores, and the processing module executes, operational instructions corresponding to at least some of the steps and/or functions illustrated in FIGS. 5-10.

The data flow control state machines 12-18, which will be described in greater detail with reference to FIGS. 6-10, generate the data control signals 32-38 based on timing sequence instructions stored therein. To load the timing sequence instructions into the corresponding state machines 12-18, the control module 35 places the ASIC 10 in the scan mode via normal/scan mode select line 28 in accordance with the input received via the input select port 54. In this mode, the instructions are scanned into the first data flow control state machine 12 via the input scan instruction port 52. The instructions are serially propagated through the scan chain until the state machines has been appropriately programmed, or reprogrammed, which may include full programming, or reprogramming, of at least one state machine or partial reprogramming of at least one state machine. When the state machines have been programmed, the control module 35, via the input select port 54, places the ASIC 10 into normal mode. Once in normal mode, the data flow control state machines 12-18 process the stored timing sequence instructions to produce the corresponding data control signals 32-38. As one of average skill in the art will appreciate, an ASIC may include more or less state machines and corresponding digital circuit modules than the ones illustrated in FIG. 5. In addition, the ASIC may include multiple scan chains and/or a single state machine may provide data control signals to multiple digital circuit modules.

Figure 6:
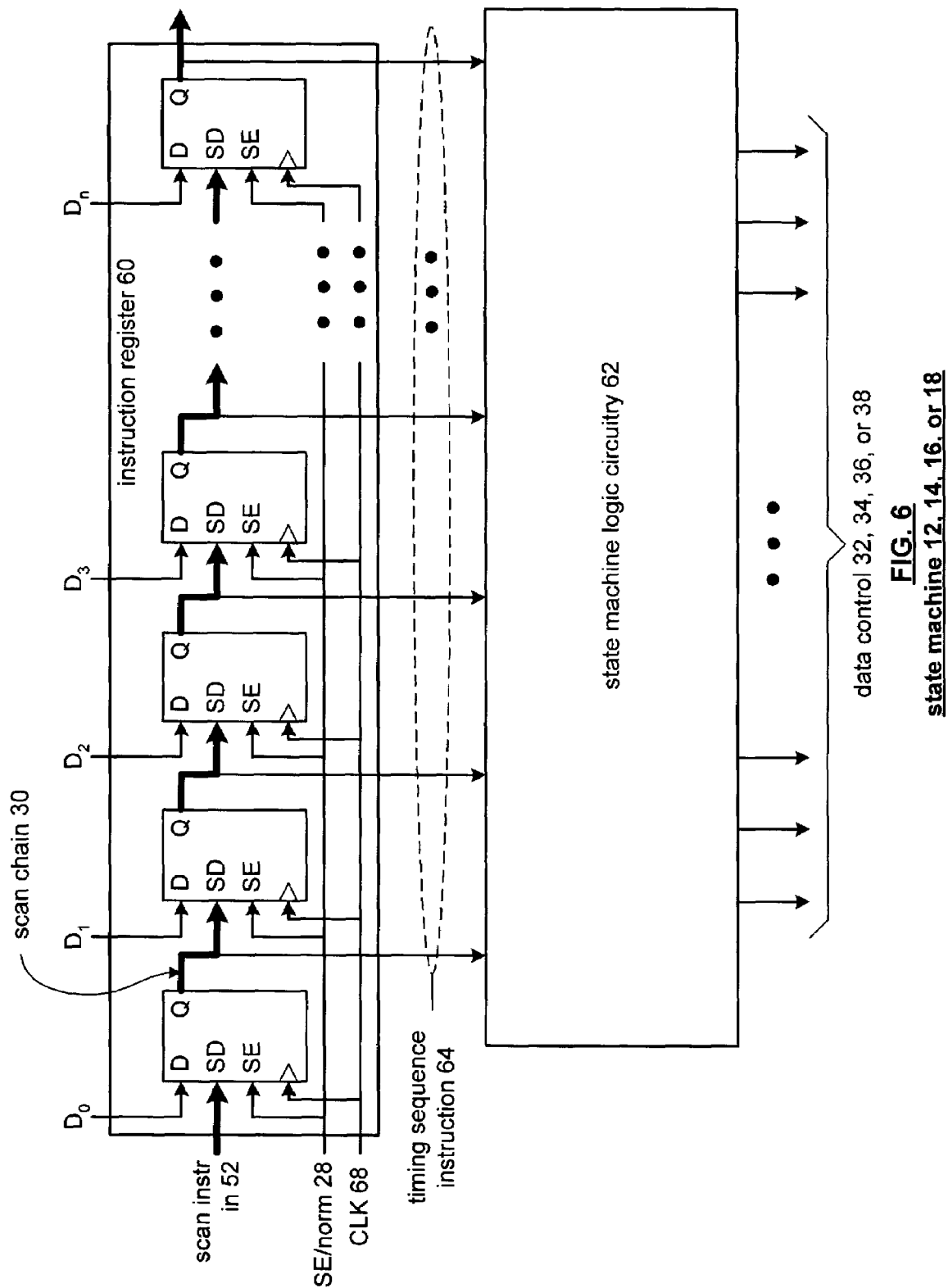
FIG. 6 is a schematic block diagram of a programmable state machine in accordance with the present invention.

FIG. 6 is a schematic block diagram of state machine 12, 14, 16 or 18, which includes an instruction register 60 and state machine logic circuitry 62. The instruction register 60 includes a plurality of scan enabled flip-flops that are operably coupled via a scan chain 30 (which is illustrated via a bold line). The number of scan enabled flip-flops within an instruction register 60 is dependent on the bit size of the timing sequence instruction 64 and the number of timing sequence instructions to be implemented by the state machine.

In this example, the plurality of scan enabled flip-flops store a timing sequence instruction 64 during scan mode. During normal mode, the state machine logic circuitry 62 retrieves the timing sequence instruction 64 and produces the corresponding data control signal 32, 34, 36 or 38 therefrom. The digital circuitry comprising the state machine logic circuitry 62 is dependent on the particular data flow control signals to be created. The particular data flow control signals to be created are dependent on the functionality of the digital circuit modules to which the data control signals are provided. An example of a state machine implemented in accordance with the present invention will be described with reference to FIG. 10.

Figure 7:
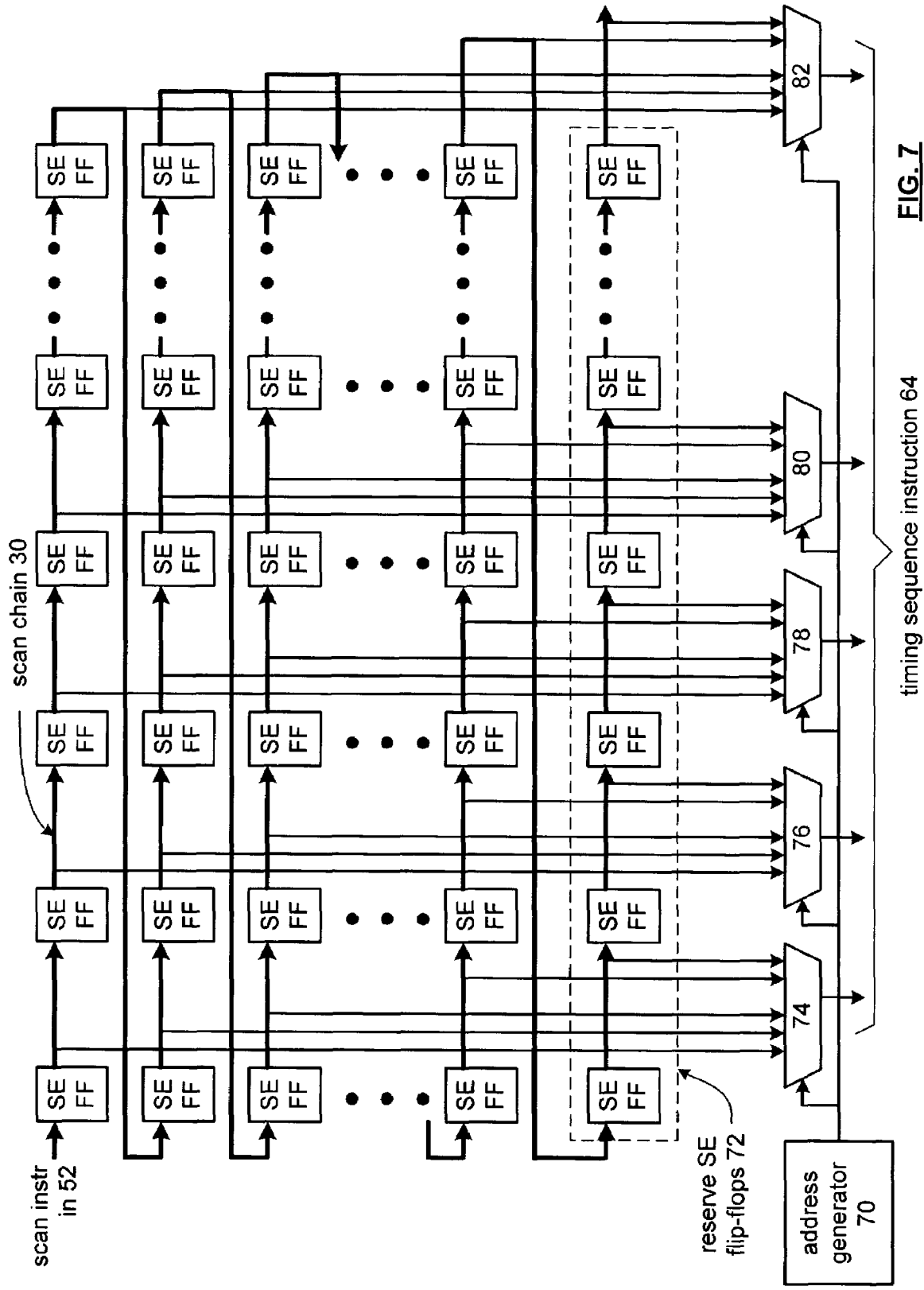
FIG. 7 is a schematic block diagram of an alternate programmable state machine in accordance with the present invention.

FIG. 7 is a more detailed schematic block diagram of the instruction register 60 of the state machines illustrated in FIG. 6. In this example, the instruction register includes a plurality of scan enabled flip-flops (SEFF) arranged as a plurality of registers. Accordingly, each row of scan enabled flip-flops stores a unique timing sequence instruction. The number of flip-flops in each register depends on the bit size of the timing sequence instruction 64 and the number of rows of flip-flop registers is dependent on the number of timing sequence instructions to be implemented.

To provide greater flexibility in subsequent programming, the instruction register 60 may include a plurality of reserve scan enable flip-flops 72. In this example, one row of additional flip-flops is shown. However, as one of average skill in the art will appreciate, additional rows of scan enabled flip-flops may be included to provide greater flexibility in subsequent programming.

The state machine illustrated in FIG. 7 also includes an address generator 70 and a plurality of multiplexors 74-82. In this example, the address generator 70 produces a control signal that selects one of the rows of scan enabled flip-flops to produce the timing sequence instruction 64. The selection of the scan enabled flip-flop may be done based on an external event, such as a signal transition from 1 to 0, and/or on the corresponding timing sequence instruction of the one of the plurality of instruction registers (e.g., scan enabled flip-flops) or another one of the plurality of instruction registers. Accordingly, the address generator 70 may be a simple counter that counts the instructions based on circuitry within the state machine logic 62. As such, utilizing the address generator 70 and multiplexor 74-82, one of the timing sequence instructions 64 may be retrieved from the plurality of instruction registers. When another instruction is needed, which may be determined based on expiration of a number of cycles that the current instructions is needed, the address generator 70 generates a different control signal causing a different one of the registers to be selected providing a different timing sequence instruction 64.

As one of average skill in the art will appreciate, the address generator 70 and corresponding multiplexor 74-82 are functional examples of selecting one of the timing sequence instructions. Accordingly, other types of mechanisms for reading data stored in flip-flops may be utilized.

FIG. 8 is a logic diagram of a method for programming a state machine of an integrated circuit in accordance with the present invention. The process begins at Step 90 where an application specific integrated circuit (ASIC) is placed in a scan mode. Within the ASIC, at least one state machine is operably coupled to at least one scan chain. The process then proceeds to Step 92 where at least one timing sequence instruction is loaded, via the scan chain, into scan capable registers of the state machine. The scan capable registers, as illustrated in FIGS. 6 and 7, may include a plurality of scan enabled flip-flops. The loading of the timing sequence instruction may be done serially through the scan chain illustrated in FIGS. 6 and 7. The timing sequence instruction, of which an example is illustrated in FIG. 9, may be received by reading internal or external memory of the ASIC or it may be received from an external processor via a port of the ASIC, which may be a serial port or a parallel port in combination with a parallel to serial converter. As illustrated in FIG. 9, the example of a timing sequence instruction is a 16 bit word that includes an initial count field, next address field, conditional jump field, load count field, enable count field, and control signals. Based on the other portions of the timing sequence instruction, the state machine provides the control signals contained in bits $b_0$-$b_3$ to its corresponding digital circuit module.

Returning to the discussion of FIG. 8, the process then proceeds to Step 94 where, when the timing sequence instruction or instructions have been loaded into the state machine, the scan mode is disabled and the ASIC is placed in normal mode. As one of average skill in the art will appreciate, Steps 90-94 may be repeated for each state machine contained within the application specific integrated circuit. Alternatively, each of the plurality of state machines within the ASIC may be simultaneously programmed via the scan chain or a plurality of scan chains. The process then proceeds to Step 96 where the state machine executes the timing sequence instruction or instructions.

The process then proceeds to Step 98 where a determination is made as to whether the state machine needs to be re-programmed or is being rebooted. As one of average skill in the art will appreciate, rebooting may occur at restarting of the ASIC, resetting of the ASIC, et cetera, which requires the timing sequence instructions to be reloaded in to the scan enabled flip-flops. Reprogramming of a state machine may occur when an error is found in the design of the ASIC and/or when a specification change occurs. If the state machine is not being reprogrammed or rebooted, the process reverts to Step 96.

If, however, the state machine is to be reprogrammed or rebooted, the process proceeds to Step 100. At Step 100, the scan mode of the ASIC is enabled. The process then proceeds to Step 102 where at least one timing sequence instruction is overwritten with a new timing sequence instruction, where the new timing sequence instruction is loaded via at least one scan chain. Note that the reprogramming may be a full or partial reprogramming of the instructions for the state machine. In addition, the reprogramming may include additional timing sequence instructions. The process then proceeds to Step 104 where the scan mode is disabled when the timing sequence instructions have been overwritten and/or all the new timing sequence instructions have been stored.

Figure 10:
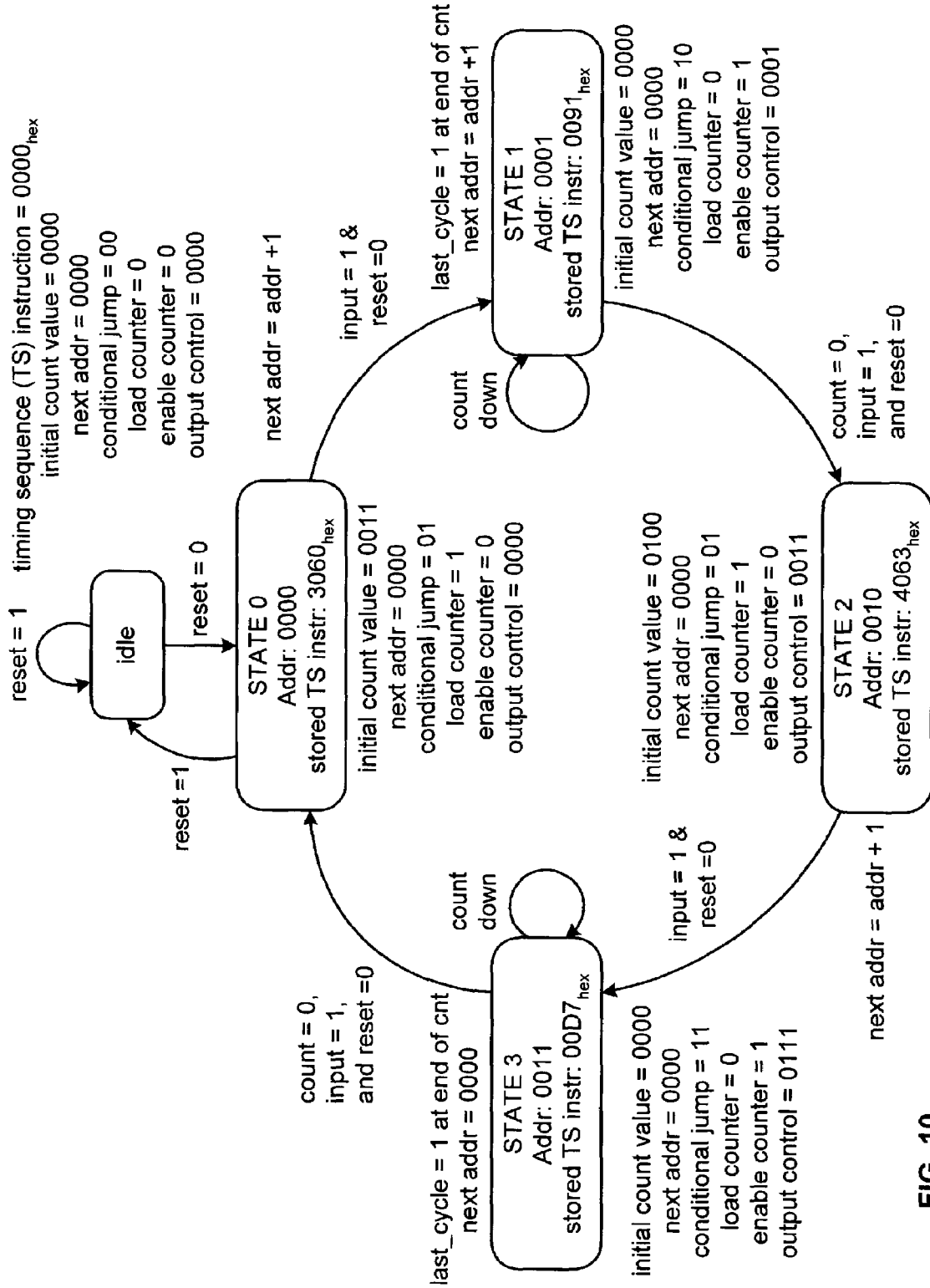
FIG. 10 is a state diagram of an example of programming a state machine in accordance with the present invention.

FIG. 10 is a state diagram of an example of a state machine in accordance with the present invention, where, unless otherwise noted the numerical values are in binary form or decimal form. As shown, the state machine includes four active states: state 0, state 1, state 2, and state 3. When the ASIC is in the reset mode (i.e., the reset signal is set to a logic 1), the timing sequence instruction has a hex value of 0000 and remains in the idle state. The fields for the timing sequence instruction of this example were illustrated in FIG. 9. Accordingly, bits 15-12 correspond to initial count value, bits 11-8 correspond to a next address, bits 6 and 7 correspond to a conditional jump, bit 5 is a load counter, bit 4 is enable counter and bits 3-0 contain the corresponding control signals.

When the ASIC is activated (i.e., reset equals zero), the state machine progresses to state 0. At state 0, the stored timing sequence instruction has a hex value of 3060. This stored timing sequence instruction is stored at address 0000 of the scan enabled flip-flops instruction registers. For example, the first row of scan enabled flip-flops of FIG. 7. In this state, the instruction 3060 (hex) corresponds to an initial count value of 0011, a next address of 0000, a conditional jump of 01, a load counter of 1, an enable counter of 0 and an output control signal of 0000. The conditional jump field may be in one of four states. If the conditional jump field is 00, then the address is unchanged; if the conditional jump field includes 01 and the input signal is 1, then the address corresponds to the next incremented address (e.g., if the current address is 0000 and the input is 1 then the next incremented address is 0001). If the conditional jump field includes 10, and the last cycle of a countdown cycle is set, the address equals the current address plus 1. If the conditional jump field includes 11, and the last cycle of a countdown sequence is set, the address is the address indicated in the address field of the corresponding timing sequence instruction. As such, for the timing sequence instructions stored at address 0000, the conditional jump of 01 indicates that the next address to be addressed is the current address plus 1. In addition, the counter is enabled to load the initial count value of 0011.

The state then transitions to state 1 where the countdown is enabled such that the counter counts down from the 0011 to 0000. At address 0001, the stored timing sequence instruction of 0091 (hex) is stored. This corresponds to an initial count value of 0000, next address of 0000, conditional jump of 10, load counter of 0, count enable of 1, and an output control signal of 0001. In this state, the initial count value and next address are unused. As such, in this state, the state machine tests when the counter has counted down from the initial value of 0011 to zero. When this condition is met, the state machine sets the last cycle field to 1. In addition, the output signals of this state, which were used to control data flow a digital logic circuitry, are set to 0001.

The state machine then transitions to state 2 when the count down at state 1 is 0000. At state 2, the corresponding timing sequence instruction of 4063 (hex) is stored at instruction register address 0010. This stored timing sequence instruction indicates an initial count value of 0100, next address of 0000, conditional jump of 01, load counter of 1, enable counter of 0, and output control signal of 0011. The conditional jump indicates that the next address to be addressed is the current address plus 1. At this point, the state machine transitions to state 3.

At state 3, the stored timing sequence instruction of 00D7 (hex) is retrieved. The corresponding initial count value is 0000, next address is 0000, conditional jump is 11, load counter is 0, enable counter is 1, and output control signal is 0111. Accordingly, in this state with the counter enabled, the counter counts down from 0100 to 0000. Once the counter has counted down to zero, the last cycle field is set to 1 and the conditional jump causes the next address field to be addressed. The next address field is 0000, causing the state machine to proceed to state 0.

By programming the state machine using the timing sequence instructions via scan enabled flip-flop registers, if an error were to occur in the programming of these instructions, the error could be easily overcome by reprogramming the state machine via the scan chain as previously described. For example, if at address location 001, a timing sequence instruction of 001A1 were programmed instead of 0091, reprogramming the state machine could easily rectify this error.

The following VHDL program is an example implementation of the example of FIG. 10.

```
library IEEE;
use IEEE.std_logic_1164.all;
use IEEE.std_logic_arith.all;
use IEEE.std_logic_signed.all;
entity example is
    port(
        clk,in1,reset       :in std_logic;
        out1                :out std_logic_vector(3 downto 0)
    );
end example;
architecture sequencer of example is
type MEMORY is array (3 downto 0) of std_logic_vector(15 downto 0);
signal code_mem         :MEMORY ;
signal micro_code       :std_logic vector(15 downto 0);
signal addr_last        :std_logic vector(3 downto 0);
signal addr_current     :std_logic vector(3 downto 0);
signal cycle_count      :std_logic vector(3 downto 0);
signal cycle_init       :std_logic vector(3 downto 0);
signal last_cycle       :std_logic;
signal load_count       :std_logic;
signal count_enable     :std_logic;
begin
-=-=-=-=-=-=-=-=-=-=-=-=-=-=-=-=-=-=-=-=-=-
- - Instruction Format Description (bit assiments) :
- -   interval counter initial value    :bits(15: 12)
- -   next address field                :bits(11: 8)
- -   conditional jump field            :bits(7:6)
- -       00          - - addr = addr
- -       01          - - if in 1 = 1,addr++
- -       10          - - if last_cycle = '1' addr++;
- -       11          - - if last_cycle ='1' addr = address field;
- -   load counter                      : 5
- -   count_enable                      : 4
- -   control signal                    : 3 : 0
-=-=-=-=-=-=-=-=-=-=-=-=-=-=-=-=-=-=-=-=-=-
code_process; process(clk,reset)
begin
    if reset = '1' then
        code_mem(0)    <= X"3060";
        code_mem(1)    <= X"0091";
        code_mem(2)    <= X"4063";
        code_mem(3)    <= X"00D7";
        micro_code     <= (others => '0';
    elsif clk'event and clk= '1' then
        micro_code <= code_mem(conv_integer(addr_current));
    end if;
end process;
out1           <= micro_code(3 downto 0);
cycle_init     <= micro_code(15 downto 12);
load_count     <= micro_code(5);
count_enable   <= micro_code(4);
addr_process: process(clk, reset)
begin
    if reset = '1' then
        addr_last <= (others => '0');
    elsif clk'event and clk= '1' then
        addr_last <= addr_current
    end if;
end process;
addr_current_process: process(micro_code)
begin
    addr_current <= (others => '0');
    case micro_code(7 downto 6) is
        when "00" =>
            addr_current <= addr_last;
        when "01" =>
            if(in1 = '1') then
                addr_current <= unsigned(addr_last) + 1;
            end if;
```

```
            when "10" =>
                if (last_cycle = '1') then
                    addr_current <= unsigned(addr_last) + 1;
                end if;
            when "11" =>
                if (last_cycle = '1') then
                    addr_current <= micro_code(11 downto 8);
                end if;
            when others =>
                addr_current <= addr_last;
        end case;
end process;
last_cycle <= '1' when cycle_count = "0000" and count_enable = '1'
                              else '0';
count_process: process(clk, reset)
begin
    if reset = '1' then
        cycle_count <= "0000";
    elsif clk'event and clk= '1' then
        if (load_count = '1') then
            cycle_count <= cycle_init;
        elsif count_enable = '1' then
            cycle_count <= unsigned (cycle_count) -1;
        end if;
    end if;
end process;
end sequencer;
-=-=-=-=-=-=-=-=-=-=-=-=-=-=-=-=-=-=-=-=-=-=-=-=-
```

The preceding discussion has presented a method and apparatus for a programmable state machine. By including programmable state machines in application specific integrated circuits, design errors may be readily overcome and specification and/or standard changes may be readily adapted to without the need for retooling the math sets and reproducing silicon to test the engineering changes. As one of average skill in the art will appreciate, other embodiments may be derived from the teaching of the present invention, without deviating from the scope of the claims.

What is claimed is:

1. A method for programming a state machine of an integrated circuit, the method comprises:
   enabling scan mode of a scan/normal mode state for the integrated circuit, wherein the state machine is operably coupled to at least one scan chain;
   loading, through the at least one scan chain, at least one timing sequence instruction into scan capable registers of the state machine;
   enabling normal mode of the scan/normal mode state when the at least one timing sequence instruction has been loaded;
   in the normal mode, generating, by the state machine, a data control signal based on the at least one timing seciuence instruction; and
   in the normal mode, providing, by the state machine, the data control signal to a digital circuit module that converts a digital input into a digital output based on the data control signal.

2. The method of claim 1 further comprises reprogramming the state machine by:
   enabling the scan mode;
   overwriting, via the at least one scan chain, the at least one timing sequencer instruction with at least one new timing sequence instruction; and
   disabling the scan mode when the at least one timing sequence instruction has been overwritten.

3. The method of claim 1 further comprises:
   enabling the scan mode of the scan/normal mode state, wherein a plurality of state machines is operably coupled to the at least one scan chain of the integrated circuit, wherein the plurality of state machines includes the state machine;
   loading, through the at least one scan chain, a plurality of timing sequence instructions into scan capable registers of corresponding ones of the plurality of state machines, wherein the plurality of timing sequence instructions includes the at least one timing sequence instruction;
   enabling the normal mode of the scan/normal mode state when the plurality of timing sequence instructions has been loaded;
   in the normal mode, generating, by the plurality of state machines, a plurality of data control signals based on the plurality of timing sequence instructions; and
   in the normal mode, providing, by the plurality of state machines, the plurality of data control signals to a plurality of digital circuit modules, wherein the plurality of data control signals includes the data control signal and the plurality of digital circuit modules includes the digital circuit module.

4. The method of claim 1, wherein the loading of the at least one timing sequence instruction further comprises serially loading the at least one timing sequence instruction through the at least one scan chain.

5. The method of claim 1, wherein the loading of the at least one timing sequence instruction further comprises:
   reading the at least one timing sequence instruction from memory.

6. The method of claim 1, wherein the scan capable registers of the state machine further comprise scan enabled flip-flops.

7. The method of claim 1, wherein the loading of the at least one timing sequence instruction further comprises:
   receiving the at least one timing sequence instruction from a processor via a serial port of the integrated circuit.

8. The method of claim 1, wherein the at least one timing sequence instruction comprises at least one of an initial count value field, a next address field, a conditional jump field, a load counter field, a count enable field, and control signals.

9. A programmable state machine of an integrated circuit comprises:
processing module; and
memory operably coupled to the processing module, wherein the memory stores operational instructions that cause the processing module to:
enable scan mode of a scan/normal mode state of the integrated circuit, wherein the state machine is operably coupled to at least one scan chain;
load, through the at least one scan chain, at least one timing sequence instruction into scan capable registers of the state machine; and
enable normal mode of the scan/normal mode state when the at least one timing sequence instruction has been loaded, wherein, in the normal mode, the state machine generates a data control signal based on the at least one timing sequence instruction and provides the data control signal to a digital circuit module.

10. The programmable state machine of claim 9, wherein the memory further comprises operational instructions that cause the processing module to reprogram the state machine by:
enabling the scan mode;
overwriting, via the at least one scan chain, the at least one timing sequencer instruction with at least one new timing sequence instruction; and
disabling the scan mode when the at least one timing sequence instruction has been overwritten.

11. The programmable state machine of claim 9, wherein the memory further comprises operational instructions that cause the processing module to:
enable scan mode of the scan/normal mode state, wherein a plurality of state machines is operably coupled to the at least one scan chain of the integrated circuit, wherein the plurality of state machines includes the state machine;
load, through the at least one scan chain, a plurality of timing sequence instructions into scan capable registers of corresponding ones of the plurality of state machines, wherein the plurality of timing sequence instructions includes the at least one timing sequence instruction; and
enable the normal mode of the scan/normal mode state when the plurality of timing sequence instructions has been loaded, wherein, in the normal mode, the plurality of state machines generate a plurality of data control signals based on the plurality of timing sequence instructions and provide the plurality of data control signals to a plurality of digital circuit modules, wherein the plurality of data control signals includes the data control signal and the plurality of digital circuit modules includes the digital circuit module.

12. The programmable state machine of claim 9, wherein the memory further comprises operational instructions that cause the processing module to load the at least one timing sequence instruction by serially loading the at least one timing sequence instruction through the at least one scan chain.

13. The programmable state machine of claim 9, wherein the memory further comprises operational instructions that cause the processing module to load the at least one timing sequence instruction by:
reading the at least one timing sequence instruction from memory.

14. The programmable state machine of claim 9, wherein the scan capable registers of the state machine further comprise scan enabled flip-flops.

15. The programmable state machine of claim 9, wherein the memory further comprises operational instructions that cause the processing module to load the at least one timing sequence instruction by:
receiving the at least one timing sequence instruction from a processor via a serial port of the integrated circuit.

16. The programmable state machine of claim 9, wherein the at least one timing sequence instruction comprises an initial count value field, a next address field, a conditional jump field, a load counter field, a count enable field, and control signals.

17. An on-chip programmable circuit comprises:
at least one instruction register, wherein each of the at least one instruction registers includes:
a plurality of scan enabled flip-flops operably coupled to:
store at least one timing sequence instruction from at least one scan chain when the on-chip programmable circuit is in a scan mode, the at least one timing sequence instruction is written into the plurality of scan enabled flip-flops; and
provide the at least one timing sequence instruction when the on-chip programmable circuit is in a normal mode; and
state machine logic circuitry operably coupled to process the at least one timing sequence instruction to produce at least one control signal when the on-chip programmable circuit is normal mode; and
a digital circuit module coupled to convert input data into output data based on the at least one control signal when the on-chip programmable circuit is the normal mode.

18. The on-chip programmable circuit of claim 17 further comprises:
a plurality of reserved scan enabled flip-flops operably coupled to the scan chain and is operably coupled to store at least one additional timing sequence instruction when the on-chip programmable circuit is reprogrammed.

19. The on-chip programmable circuit of claim 17, wherein the at least one instruction register further comprises a plurality of instruction registers, wherein each of the plurality of instruction registers stores a corresponding timing sequence instruction of a state machine algorithm.

20. The on-chip programmable circuit of claim 19, wherein the state machine logic circuitry further comprises:
an address generator operably coupled to address one of the plurality of instruction registers based on at least one of an external event and the corresponding timing sequence instruction of the one of the plurality of instruction registers or another one of the plurality of instruction registers.

21. The on-chip programmable circuit of claim 17, wherein the at least one timing sequence instruction comprises an initial count value field, a next address field, a conditional jump field, a load counter field, a count enable field, and control signals.

22. The on-chip programmable circuit of claim 17, wherein the plurality of scan enabled flip-flops is daisy chained together to serially receive and store the at least one timing sequence instruction.

23. A programmable application specific integrated circuit (ASIC) comprises:
- plurality of data flow control state machines, wherein each of the plurality of data flow control state machines generates at least one control signal and includes:
  - at least one instruction register, wherein each of the at least one instruction registers includes:
    - a plurality of scan enabled flip-flops operably coupled to:
      - store at least one timing sequence instruction when the programmable ASIC is in a scan mode, the at least one timing sequence instruction is written into the plurality of scan enabled flip-flops; and
      - provide the at least one timing sequence instruction when the programmable ASIC is in a normal mode;
  - state machine logic circuitry operably coupled to process the at least one timing sequence instruction to produce the at least one control signal when the the programmable ASIC is in the normal mode;
- plurality of digital circuit modules, each of the plurality of digital circuit modules operably coupled to process data based on the at least one control signal of a corresponding one of the plurality of data flow control state machines; and
- control module operably coupled to establish the scan mode and the normal mode based on a mode select input.

24. The programmable ASIC of claim 23 further comprises:
- an input select port operably coupled to receive the mode select input, wherein the mode select input is one of: program mode, scan mode, reprogram mode, and normal mode, wherein during the program mode or the reprogram mode, the control module enables the scan mode such that at least one of the plurality of data flow control state machines is programmed or reprogrammed.

25. The programmable ASIC of claim 23, wherein at least one of the plurality of data flow control state machines further comprises:
- a plurality of reserved scan enabled flip-flops operably coupled to the scan chain and is operably coupled to store at least one additional timing sequence instruction when the on-chip programmable state machine is reprogrammed.

26. The programmable ASIC of claim 23, wherein the at least one instruction register further comprises a plurality of instruction registers, wherein each of the plurality of instruction registers stores a corresponding timing sequence instruction of a state machine algorithm.

27. The programmable ASIC of claim 26, wherein the state machine logic circuitry further comprises:
- an address generator operably coupled to address one of the plurality of instruction registers based on at least one of an external event and the corresponding timing sequence instruction of the one of the plurality of instruction registers or another one of the plurality of instruction registers.

28. The programmable ASIC of claim 23, wherein the at least one timing sequence instruction comprises an initial count value field, a next address field, a conditional jump field, a load counter field, a count enable field, and control signals.

29. The programmable ASIC of claim 23, wherein the plurality of scan enabled flip-flops is daisy chained together to serially receive and store the at least one timing sequence instruction.

30. The programmable ASIC of claim 23 further comprises:
- a port operably coupled to the scan chain, wherein the at least one timing sequence instruction is programmed or reprogrammed into the plurality of scan enabled flip-flops via the scan chain.

* * * * *

UNITED STATES PATENT AND TRADEMARK OFFICE
CERTIFICATE OF CORRECTION

PATENT NO. : 7,464,310 B2  Page 1 of 1
APPLICATION NO. : 10/260361
DATED : December 9, 2008
INVENTOR(S) : Weizhuang Wayne Xin It is certified that error appears in the above-identified patent and that said Letters Patent is hereby corrected as shown below:

Column 11, line 54, in Claim 1: replace "seciuence" with --sequence--.

Signed and Sealed this

Twenty-sixth Day of May, 2009

JOHN DOLL
*Acting Director of the United States Patent and Trademark Office*